US009023307B2

(12) United States Patent
Hemley et al.

(10) Patent No.: US 9,023,307 B2
(45) Date of Patent: May 5, 2015

(54) PRODUCTION OF LARGE, HIGH PURITY SINGLE CRYSTAL CVD DIAMOND

(75) Inventors: Russell J. Hemley, Washington, DC (US); Yu-fei Meng, Washington, DC (US); Chih-Shiue Yan, Washington, DC (US); Ho-kwang Mao, Washington, DC (US)

(73) Assignee: Carnegie Institution of Washington, Washington, DC (US)

( * ) Notice: Subject to any disclaimer, the term of this patent is extended or adjusted under 35 U.S.C. 154(b) by 284 days.

(21) Appl. No.: 13/109,528

(22) Filed: May 17, 2011

(65) Prior Publication Data

US 2011/0280790 A1    Nov. 17, 2011

Related U.S. Application Data

(60) Provisional application No. 61/345,413, filed on May 17, 2010.

(51) Int. Cl.
| | |
|---|---|
| C01B 31/06 | (2006.01) |
| C30B 25/18 | (2006.01) |
| C30B 25/02 | (2006.01) |
| C30B 29/04 | (2006.01) |
| C30B 25/10 | (2006.01) |

(52) U.S. Cl.
CPC ............... *C30B 29/04* (2013.01); *C30B 25/105* (2013.01)

(58) Field of Classification Search
None
See application file for complete search history.

(56) References Cited

U.S. PATENT DOCUMENTS

| | | | |
|---|---|---|---|
| 5,284,709 A | 2/1994 | Herb et al. | |
| 6,858,078 B2 | 2/2005 | Hemley et al. | |
| 7,128,974 B2 * | 10/2006 | Scarsbrook et al. | .......... 428/408 |
| 7,157,067 B2 | 1/2007 | Hemley et al. | |
| 7,594,968 B2 | 9/2009 | Hemley et al. | |
| 7,883,684 B2 * | 2/2011 | Hemley et al. | ................ 423/446 |
| 2009/0142249 A1 | 6/2009 | Meguro et al. | |
| 2009/0297429 A1 * | 12/2009 | Vohra et al. | ................... 423/446 |
| 2010/0123098 A1 | 5/2010 | Hemley et al. | |
| 2010/0126406 A1 | 5/2010 | Yan et al. | |
| 2013/0239615 A1 * | 9/2013 | Misra | ................................ 63/32 |
| 2014/0220261 A1 * | 8/2014 | Asmussen et al. | ............ 427/570 |

OTHER PUBLICATIONS

International Search Report and Written Opinion issued in the corresponding PCT Application PCT/US2011/036780, mailed Sep. 9, 2011.

* cited by examiner

*Primary Examiner* — Guinever Gregorio
(74) *Attorney, Agent, or Firm* — Morgan Lewis & Bockius LLP

(57) ABSTRACT

The invention relates to single crystal diamond with high optical quality and methods of making the same. The diamond possesses an intensity ratio of the second-order Raman peak to the fluorescence background of around 5 or greater.

8 Claims, 6 Drawing Sheets

PRODUCTION OF LARGE, HIGH PURITY SINGLE CRYSTAL CVD DIAMOND

This application claims priority benefit of U.S. Provisional Application No. 61/345,413, filed on May 17, 2010, which is hereby incorporated by reference in its entirety.

STATEMENT OF INTEREST

This invention was supported by NSF-EAR, DOE-NNSA (CDAC), the Balzan Foundation and the Deborah Rose Foundation. The U.S. Government has certain rights to the invention.

BACKGROUND OF THE INVENTION

1. Field of the Invention

The present invention relates to a method for producing a large colorless high purity single crystal diamond using Microwave Plasma Chemical Vapor Deposition (MPCVD) without using a subsequent annealing step.

2. Description of Related Art

Large-scale production of synthetic diamond has long been an objective of both research and industry. Diamond, in addition to its gem properties, is the hardest known material, has the highest known thermal conductivity, and is transparent to a wide variety of electromagnetic radiation. These and other characteristics, therefore, make diamond very valuable industrially and open up a wide range of applications in a number of industries, in addition to its well-established value as a gemstone.

For at least the last twenty years, a process of producing small quantities of diamond by chemical vapor deposition (CVD) has been available. See B. V. Spitsyn et al., "Vapor Growth of Diamond on Diamond and Other Surfaces," Journal of Crystal Growth, Vol. 52, pp. 219-226. The process involves chemical vapor deposition of diamond on a substrate by using a combination of methane, or another simple hydrocarbon gas, and hydrogen gas at reduced pressures and temperatures of 800-1200° C. Hydrogen gas is included to prevent the formation of graphite as the diamond nucleates and grows. Growth rates of up to 1 μm/hour were reported with this technique.

Subsequent work, for example, that of Kamo, et al. as reported in "Diamond Synthesis from Gas Phase in Microwave Plasma," Journal of Crystal Growth, vol. 62, pp. 642-644, has demonstrated the use of MPCVD to produce diamond at pressures of 1-8 kPa and temperatures of 800-1000° C. with microwave power of 300-700 W at a frequency of 2.45 GHz. A concentration of 1-3% methane gas was used in the process of Kamo et al. Maximum growth rates of 3 μm/hour were reported using this MPCVD process. In the above-described processes, and in a number of other reported processes, the growth rates are limited to only a few micrometers per hour.

Until recently, the known higher-growth rate processes only produced polycrystalline forms of diamonds. However, single crystal diamonds offer a variety of advantages over polycrystalline diamonds. Accordingly, considerable interest has been shown in recent years towards developing procedures which enable the fast growth of single-crystal CVD diamond by MPCVD.[1-4] It has been reported, for example, that nitrogen addition to MPCVD reaction chemistry (methane/hydrogen plasma) can significantly enhance the growth of {100} facets and produce smooth and continuous diamond surfaces.[1,5] Yan et al.[1] originally reported high growth rates of up to 100 μm/hr, two orders of magnitude higher than standard processes for making CVD diamond at the time. Since then, efforts have been made to increase the growth rate[3] or expand the growth area[4] for single-crystal CVD diamond.

Considerable interest has also been shown in recent years towards developing procedures to produce clear, colorless, high optical quality single crystal diamond by chemical vapor deposition. Typically, such procedures have included the additional step of annealing the diamond produced by chemical vapor deposition. A need exists, however, to efficiently produce clear, colorless, high optical quality single crystal diamond using only the chemical vapor deposition process.

SUMMARY OF THE INVENTION

The inventors have developed a microwave plasma assisted chemical vapor deposition (MPCVD) technique to produce large diamond single-crystals at very high growth rates (up to 200 μm/hr) and have succeeded in fabricating single crystals above 12 mm thickness (or 10 carats in size) and having a variety of optical and mechanical properties.

Broadly stated, the invention provides an improvement in prior microwave plasma chemical vapor deposition (MPCVD) procedures enabling growth of clear, colorless, high optical quality single crystal CVD diamond at a high growth rate (over 50 micrometers per hour) without an annealing step. The invention is based to a significant extent on the finding that such high optical quality single crystal diamond can be grown by MPCVD in a process by which the crystal orientation of the substrate on which the single crystal diamond is grown is 5-10 degrees off {100} while maintaining a growth temperature from about 1250 to 1350 degrees C. Additionally, measures are taken to ensure that nitrogen is not allowed to enter the deposition chamber atmosphere.

DESCRIPTION OF THE DRAWINGS

The invention is more fully described by reference to the accompanying drawings wherein.

DETAILED DESCRIPTION

Figure 1:
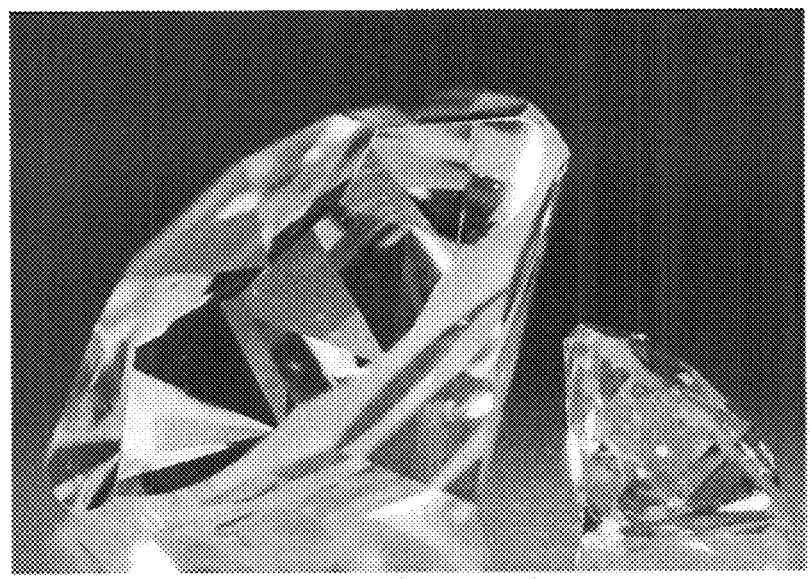
FIG. 1 shows a 2.3 carat colorless high-purity single crystal CVD diamond as compared to a 0.25 carat CVD diamond.

The inventors have developed a microwave plasma assisted chemical vapor deposition (MPCVD) technique to produce large diamond single-crystals at very high growth rates (up to 200 μm/hr) and have succeeded in fabricating single crystals above 12 mm thickness (or 10 carats in size) and having a variety of optical and mechanical properties. Importantly, the MPCVD techniques of the present invention can be used to produce large, high optical quality single crystal diamond without a subsequent annealing step.

Recently, these techniques have been refined to produce large, high purity single crystal diamond anvils. The example shown in FIG. 1 was cut from a 13.5 carat SC-CVD diamond block grown at high growth rates (around 50 μm/hr) in the absence of impurities other than hydrogen.

High-purity CVD single crystal material is technically more difficult to grow than brown material. One challenge the industry has faced is finding ways to routinely and reliably produce synthetic diamonds larger than 1 carat.

Certain U.S. patents and patent applications provide information related to methods for producing single crystal CVD diamond. Applicants thereby incorporate the following patents and patent applications by reference: U.S. Pat. No. 6,858,078; U.S.; U.S. application Ser. No. 11/438,260 and U.S. application Ser. No. 12/624,768.

A table of diamonds made by the methods of the present invention is provided below.

| No. | Cut   | Carat | Color | Clarity | Dimension (mm)           |
|-----|-------|-------|-------|---------|--------------------------|
| 1   | plate |       | D     |         | 12 × 5.3 × 0.5           |
| 2   | plate |       | G     |         | 9 × 9 × 2.0              |
| 3   | anvil | 0.47  | H     | SI2     | 5.1 × 3.0                |
| 4   | anvil | 0.25  | H     |         | 3.5 × 2.6                |
| 5   | anvil | 0.22  | I     |         | 3.6 × 2.4                |
| 6   | anvil | 2.30  | J     | SI1     | 8.5 × 5.2                |
| 7   | anvil | 0.54  | J     | SI2     | 5.2 × 3.2                |

UV-VIS absorption, Raman/photoluminescence spectroscopy, cathodoluminescence, birefringence topography were used to characterize the diamond anvil and other counterparts. The measurements show that the material has high optical quality and clarity. The testing has shown that high purity CVD single crystal material has been grown at high growth rates (around 50 μm/hr.). The material has high optical quality and clarity without a layer structure. The high purity single crystal CVD diamond has a large intensity ratio (above 5) of the second-order Raman peak to the background. Such diamond shows promise as a material for a high pressure window as well as a material in other applications including, but not limited to, gems, high pressure anvils and other electronic and mechanical devices.

Growth conditions include taking advanced measures to preclude the introduction of nitrogen into the CVD chamber. The nitrogen content in the reaction gases (e.g., $H_2$, $CH_4$, $CO_2$, $O_2$) should be below 1 ppm to produce colorless D to J colored diamond. Precautions are also taken to preclude the introduction of other impurities.

In certain embodiments of the invention, the crystal orientation of the substrate is 0-15 degrees off {100}. Without being bound by theory, this is thought to increase the nucleation rate and reduce the level of impurities. In a preferred embodiment, the crystal orientation of the substrate is about 5-10 degrees off {100}. In another preferred embodiment, the crystal orientation of the substrate is about 7 degrees off {100}.

In one embodiment of the present invention, the growth temperature of the diamond is from about 1000 to about 1400 degrees C. In another embodiment, the growth temperature is from about 1250 to about 1350 degrees C. In another embodiment, the growth temperature of the diamond is about 1300 degrees C. Without being bound by theory, it is thought that operating at this optimum growth temperature range increases the toughness of the growing diamond crystal, thus reducing the potential for growth-limiting cracks. Diamond grown in the absence of nitrogen is more susceptible to cracks than nitrogen-doped diamond. It is therefore important to prevent cracks from forming to achieve the large growth size of single crystal diamond.

The diamond of the present invention was synthesized at pressures ranging from about 100-200 torr. In one embodiment, the pressure was about 150 torr. In embodiments of the invention, gas flow rates ranged from about 30-80 sccm $CH_4$ (used as a carbon source) and 300-500 $H_2$.

EXAMPLES

The inventors have developed microwave plasma assisted chemical vapor deposition (MPCVD) techniques to produce large diamond single-crystals at very high growth rates (up to 200 μm/h) and have succeeded in fabricating single crystal diamonds above 12 mm thickness (or 10 carats in size) and having a variety of optical and mechanical properties [1-5].

Recently, these techniques have been refined to produce large, high-purity single crystal diamond anvils. A 2.3 carat colorless round CVD diamond has been successfully fabricated at high growth rates without annealing. It was cut from a 13.5 carat rough diamond block grown at around 50 μm/h in the absence of impurities other than hydrogen. Microscopic and spectroscopic measurements show that this material has high optical-quality and clarity without visible layers.

As incidated above, high-purity CVD single crystal material is technically more difficult to grow than brown material. One challenge the industry faced has been finding ways to routinely and reliably produce synthetic diamonds larger than 1 carat [7], especially diamonds that are near-colorless and colorless. One of the limitations has been the very slow growth fate that was necessary to obtain high quality material, limiting the thicknesses of synthesised crystals to a few micrometers [14].

Nitrogen is the most common impurity in synthetic diamonds. If nitrogen is present in the diamond growth environment, it is easily included in the lattice of the growing crystal [13]. Improved vacuumn is necessary for growth without nitrogen.

Another limitation is that the stress inside CVD diamond grown without nitrogen makes it crack very easily, which also hinders the achievement of big volume, high-purity diamond crystals.

A 5 kW, 2.45 GHz ASTEX MPCVD system was used for single crystal diamond synthesis in the present invention. HPHT synthetic type-Ib and single-crystal CVD diamond with {100} surfaces and minimum surface defects were used as substrates for diamond growth. A hydrogen generator with a palladium purifier was used to produce clean hydrogen with 7N purity. High purity methane (99.9995%) was also used.

Diamond was synthesized at pressures ranging from about 100-200 torr. In one embodiment, the pressure was about 150 torr. Gas flow rates ranged from about 30-80 sccm $CH_4$ (used as a carbon source) and 300-500 $H_2$. The growth temperature ranged from about 1250 to about 1350 degrees C. In another embodiment, the growth temperature of the diamond is about 1300 degrees C.

It must be noted that most of the faceted synthetic diamonds previously produced have been small (0.30 ct and less) and highly colored. Few near-colorless or colorless laboratory-grown diamonds have been encountered {12}. In May 2010, GIA Lab announced their first identification of CVD synthetic diamond over one carat (1.05 carat pear shape near-colorless) {10}. Later in November, 2010, Gemesis claimed to produce colorless CVD diamond mostly over a half carat, the largest stone being 1.11 carat {11}. These diamonds stand in contrast to the diamond produced by the methods of the present invention, characterization of which is provided below.

High Optical Quality

UV-VIS absorption, Micro-Raman/photoluminescence spectroscopy and cathodoluminescence, and birefringence microscopy were used to characterize the diamond anvil of the present invention and other counterparts. The measurements show that the material has high optical quality.

When observed under a microscope, the high purity CVD diamond is water clear and relatively free of inclusions and cracks. There are no visible layers (or growth interfaces) and striations from a cross-sectional view within the thickness above 5 mm. As shown in FIG. 1, the as-grown 2.3-carat round brilliant cut diamond, measuring 8.5×8.5×5.2 mm, was color graded as near colorless (J grade). Its clarity grade was equivalent to $SI_1$. No inclusions are observed in the center, and the diamond contains only a few inclusions on the girdle.

Another characteristic optical property is the absence of layers in the single crystal diamond of the present invention. In most CVD diamond layers or striations form as a result of a differing uptake of defects on the risers and terraces of growth steps {6}. This is characteristic in CVD diamonds, especially in nitrogen-doped CVD diamond. Such layers are invisible in this high-purity diamond.

Visible Transmission

Figure 2:
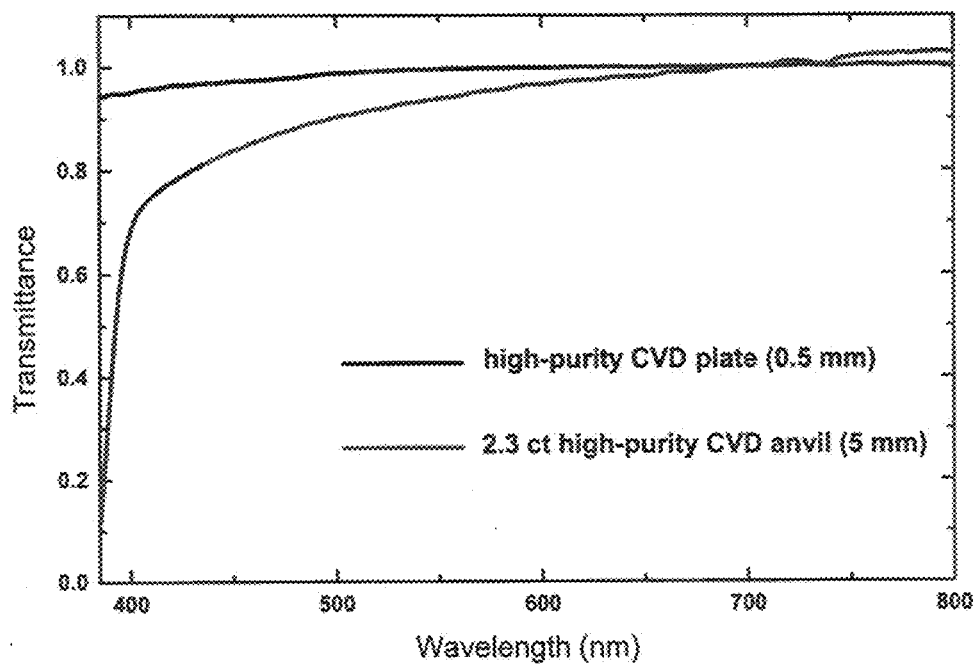
FIG. 2 provides UV-VIS transmission data for a colorless high-purity CVD diamond anvil and high-purity CVD diamond plate.

FIG. 2 shows a visible transmission spectra at 300 K for a high purity CVD diamond plate and the 2.3 carat anvil. The plate does not exhibit any absorption lines or bands in the visible region. With an optical path of 5 mm, the anvil displays relatively high transmission in the visible range (from 400 to 800 nm) and has much lower absorption than nitrogen-doped diamond. The lower transparency compared to the plate may be due to unintentional incorporation of nitrogen by leaking (discussed below). The absorption at 737 nm from the silicon-vacancy-related center (Si-V) is invisible or very weak.

Raman/Photoluminescence

Figure 3:
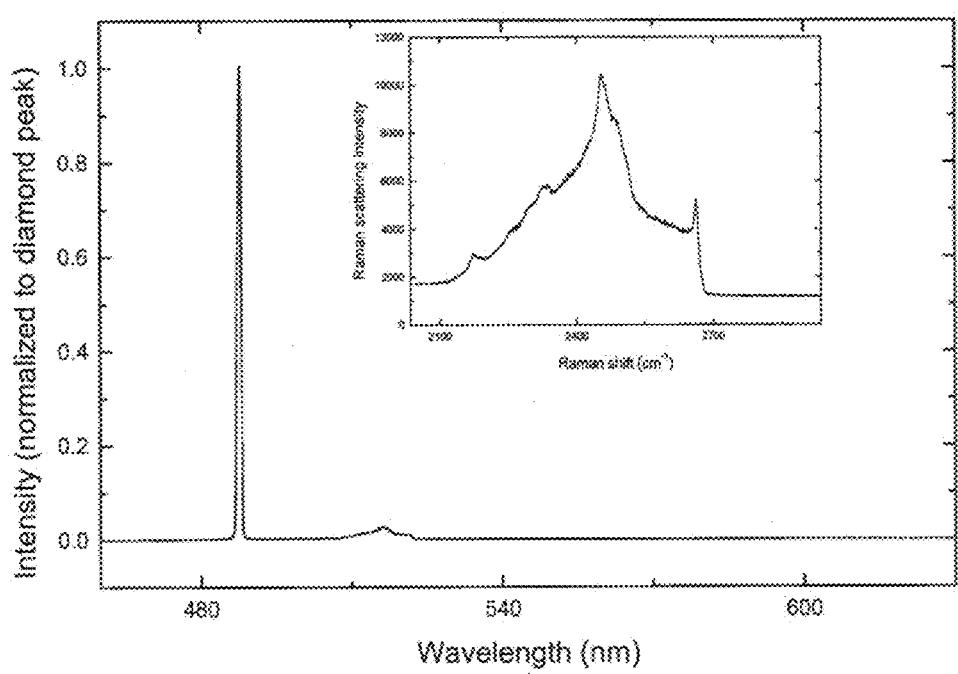
FIG. 3 provides a photoluminescence spectra of the 2.3 ct high-purity CVD diamond anvil at room temperature with 457 nm laser excitation, while me insert spectrum shows a second-order Raman peak.
Figure 4:
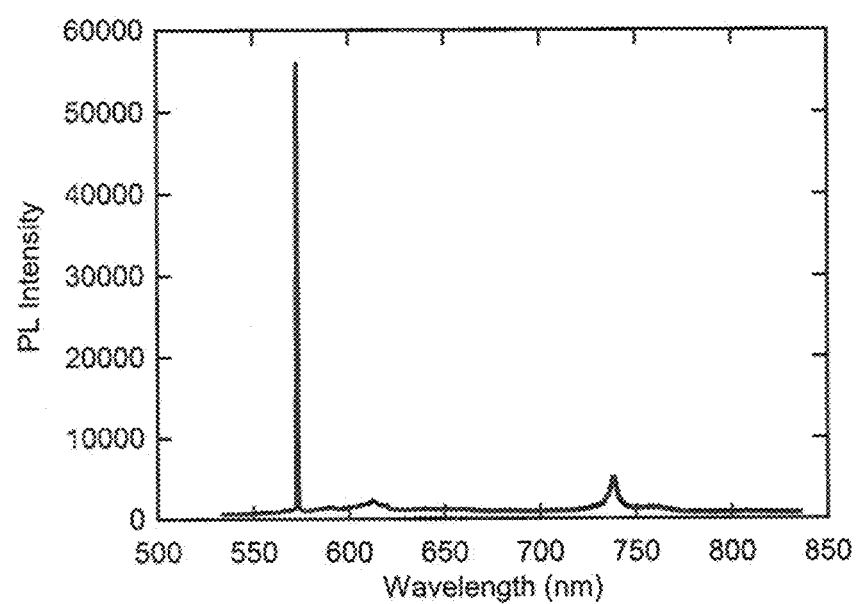
FIG. 4 provides a photoluminescence spectra of the 2.3 ct high-purity CVD diamond anvil at room temperature with a 532 nm laser excitation.

Raman/Photoluminescence (PL) spectra were measured at room temperature using a 457 nm laser (FIG. 3) and a 532 nm laser (FIG. 4) for excitation. There was no photoluminescence at 575 nm and 637 nm caused by $NV^0$ and $NV^-$ centers. A sharp diamond first-order Raman peak and a second-order Raman peak were observed as shown in FIG. 3. The intensity ratio of the second-order Raman peak to the fluorescence indicates very good crystal quality, thus rendering the diamond favorable for high-pressure optical windows. CVD diamond incorporating nitrogen usually has 575 nm and 637 nm luminescence. This leads to the characteristic orange red fluorescence which will overlap with the optical signal from the sample inside the diamond anvil cell. In the absence of NV centers, high-purity CVD diamond does not show the orange/orange-red fluorescence. There is an Si-V peak at 737 nm in the PL spectrum with 532 nm laser excitation as shown in FIG. 4.

Origin of Color

Figure 5:
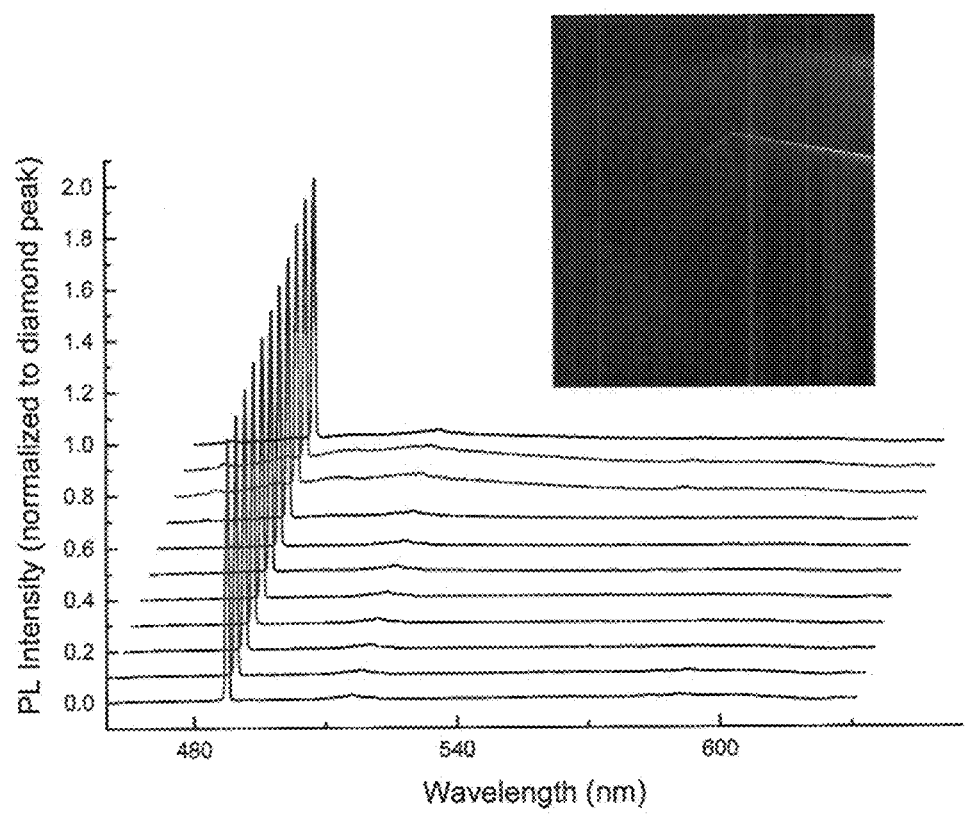
FIG. 5 provides a photoluminescence spectra measured along the growth direction from culet to girdle of the 2.3 ct anvil and corresponding cathodoluminescence picture.

Cathodoluminescence microscopy was performed on the 2.3 ct anvil. Unlike nitrogen-added CVD diamond, which displays a strong orange emission, this sample has no emission, except for an orange fine line (around 20~50 um) in a quarter section (FIG. 5). Photoluminescence (PL) spectra were measured along the growth direction from culet to girdle of the anvil (FIG. 4). All of the spectra were normalized to have an identical height of the diamond Raman peak. Higher fluorescence was detected around the area of the orange CL line. Without being bound by theory, this is likely due to an unintentional incorporation of nitrogen caused by leaking. Moreover, it might lead to the color J of the anvil.

Inclusions

Figure 6:
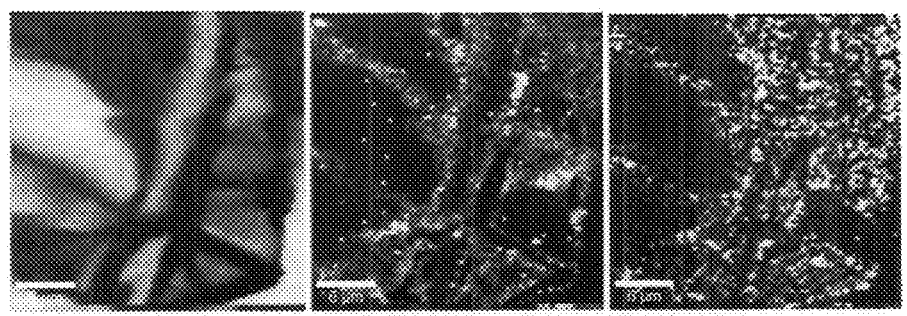
FIG. 6 shows confocal Raman mapping on the inclusion in the 2.3 ct high-purity CVD diamond.
Figure 6:
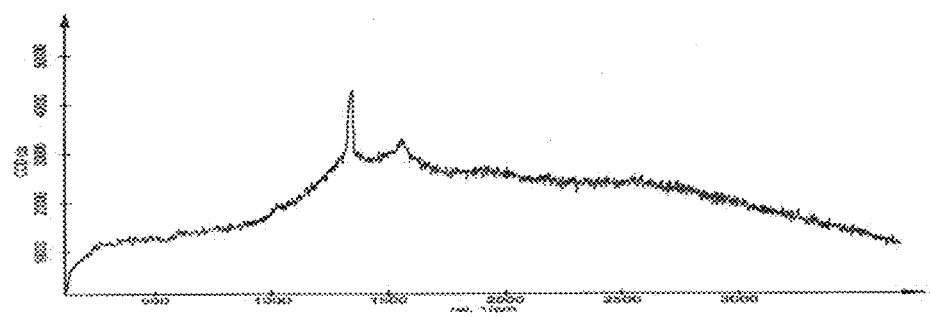

Inclusions are also characterized using confocal Raman imaging spectroscopy. FIG. 6 shows the Raman imaging results on a small (abound 30 um) black inclusion close to the girdle. The first image is the map of diamond peak intensity. The second image is the map of the broad G band caused by amorphous carbon. The third image is the map of the 1610 $cm^{-1}$ caused by graphite or nanocystalline diamond. As a result, the inclusion is composed of amorphous-carbon, graphite and nanocystalline diamond.

High-purity CVD single crystal material has been grown at high growth rates (around 50 μm/h). This material has high optical quality and clarity without visible layers. The high-purity single crystal CVD diamond has a large intensity ratio (above 5) of the second-order Raman peak to the background. It is a promising material for high pressure optical windows. The color may be due to a leak of nitrogen. The inclusion composed of amorphous-carbon, graphite and nanocystalline diamond. The 737 nm Si peak in PL, the striations in CL microscopy, and the inclusions composed of graphite, amorphous-carbon, and nanocrystalline diamond can be the features to identify these high-purity CVD diamonds from natural diamonds. With this enhanced rapid growth, high optical quality single crystal CVD diamond anvils over 1 carat can be routinely fabricated.

It is to be understood that both of the foregoing general description and the following detailed description are exemplary and are intended to provide further explanation of the invention as claimed.

LIST OF REFERENCES

[1] Yan C. S et al., *Proc. Natl. Acad. Sci.* 2002, 99, 12523-12525.

[2] Yan C. S.; Mao H. K.; Li W.; Qian J.; Zhao Y.; Hemley R. J. *Phys. Stat. Sol.* (a) 2004, 201, R25-R27.

[3] Ho S. S.; Yan C. S.; Liu Z.; Mao H. K.; Hemley R. J. *Industrial Diam. Rev.* 2006, 1, 28-32.

[4] Meng Y. F.; Yan C. S.; Lai J.; Krasnicki S.; Shu H. Y.; Yu T.; Liang Q.; Mao H. K.; Hemley R. J. *Proc. Natl. Acad. Sci.* 2008, 105, 17620-17625.

[5] Liang Q.; Yan C. S.; Meng Y. F.; Lai J.; Krasnicki S.; Map H. K.; Hemley R. J. *Diamond Relat. Mater.* 2009, 18, 698-703.

[6] Martineau P. M.; Lawson S. C.; Taylor A. J.; Quinn S. J.; Evans D. J. F.; Crowder M. J. *Gems Gemol.* 2004, 40, 2-25.

[7] https://mitsloan.mit.edu/MSTIR/IndustryEvolution/DeBeersDilemma/Pages/default.aspx

[8] Mao W. L.; Mao H. K.; Yan C. S.; Shu J. F.; Hu J. Z.; Hemley R. J. *Appl. Phys. Lett.* 2003, 83, 5190-5192.

[9] Zha C. S.; Krasnicki S.; Meng Y. F.; Yan C. S.; Lai J.; Liang Q.; Mao H. K.; Hemley R. J. *High Pressure Res.* 2009, 29, 317-324.

[10] https://app.e2ma.net/app/view:CampaignPublic/id:1401417.6668131527/rid:c3c6053875c2f236bfff5fb6b594f31a

[11] Information on http://www.jckonlidne.com/2010/11/22/jck-exclusive-gemesis-to-mass-produce-lab-grown-colorless-diamonds http://www.jckonline.com.blogs/cutting-remarks/2010/11/23/lab-grown-diamonds-living-colorless

[12] James E. Shigley, Gems & Gemology in Review: Synthetic Diamond 2005, 268-271.

[13] H. Sumiya, S. Satoh, *Diamond Relat. Mater.* 1996, 5, 1359-1365.

[14] A. Tallaire, A. T. Collins, D. Charles, J. Achard, R. Sussmann, A. Gicquel, M. E. Newton, A. M. Edmonds, R. J. Cruddace. *Diamond Relat.*

We claim:

1. In a method of producing single crystal diamond by microwave plasma chemical vapor deposition which comprises providing a substrate with a crystal orientation and establishing a microwave plasma ball in an atmosphere comprising hydrogen and a carbon source at a pressure and temperature sufficient to cause deposition of diamond on said substrate, the improvement wherein the crystal orientation of the substrate is 5-10 degrees off {100}, wherein the nitrogen content in the atmosphere is less than 1 ppm, wherein the growth temperature of the diamond is from about 1250° C. to about 1350 degrees ° C., wherein the Raman/Photoluminescence spectra of the as-made diamond measured at room temperature has no photoluminescence at 575 nm and 637 nm caused by $NV^0$ and $NV^-$ centers, and wherein the growth rate of single crystal diamond is about 200 μm/hr.

2. The method of claim 1 wherein crystal orientation of the substrate is about 7 degrees off {100}.

3. The method of claim 2 wherein the atmosphere does not comprise nitrogen.

4. The method of claim 3 wherein the diamond has a weight of 1 carat or more.

5. The method of claim 4 wherein the diamond has a weight of 10 carats or more.

6. The method of claim 4 wherein the diamond has a color grade in the range of D to J.

7. The method of claim 4 wherein the diamond has a clarity grade of S11 or clearer.

8. The method of claim 4 not comprising an annealing step.

* * * * *